ically Patent

United States Patent [19]
Wade et al.

[11] Patent Number: 4,799,192
[45] Date of Patent: Jan. 17, 1989

[54] THREE-TRANSISTOR CONTENT ADDRESSABLE MEMORY

[75] Inventors: Jon P. Wade, Boston; Charles G. Sodini, Cambridge, both of Mass.

[73] Assignee: Massachusetts Institute of Technology, Cambridge, Mass.

[21] Appl. No.: 901,514

[22] Filed: Aug. 28, 1986

[51] Int. Cl.⁴ .............................................. G11C 15/04
[52] U.S. Cl. ...................................... 365/49; 365/181
[58] Field of Search .................. 365/49, 189, 181, 190

[56] References Cited

U.S. PATENT DOCUMENTS

| 3,575,617 | 4/1971 | Burns | 365/49 |
|---|---|---|---|
| 3,701,980 | 10/1972 | Mundy | 365/49 |
| 3,765,000 | 10/1973 | Regitz | 365/149 |
| 3,846,766 | 11/1974 | Nojima et al. | 365/49 |
| 3,876,991 | 5/1975 | Nelson et al. | 365/178 |
| 4,084,108 | 5/1978 | Fujimoto | 365/150 |
| 4,112,510 | 9/1978 | Baker | 365/187 |
| 4,247,919 | 1/1981 | White, Jr. et al. | 365/222 |
| 3,705,3906 | 12/1972 | Mundy | 365/49 |

FOREIGN PATENT DOCUMENTS 0128092 7/1983 Japan .................................. 365/49

Primary Examiner—Stuart N. Hecker
Assistant Examiner—Glenn A. Gossage
Attorney, Agent, or Firm—Hamilton, Brook, Smith & Reynolds

[57] ABSTRACT

A content addressable memory cell includes two storage field effect transistors of opposite conductivity type with their gates connected in common. A single write transistor is connected between the common gates and a bitline for storing a potential on the gates from the bitline.

6 Claims, 1 Drawing Sheet

U.S. Patent  Jan. 17, 1989  4,799,192
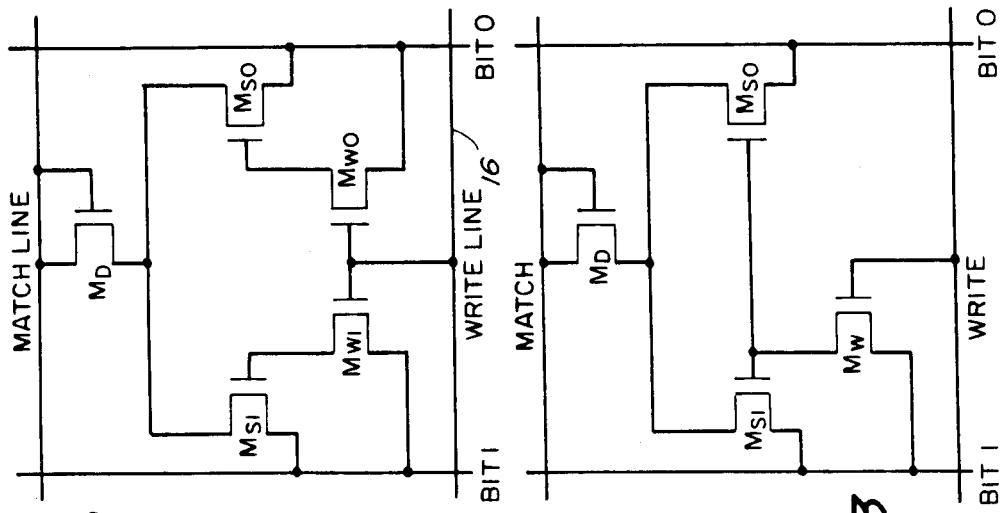
FIG. 2
PRIOR ART
FIG. 3
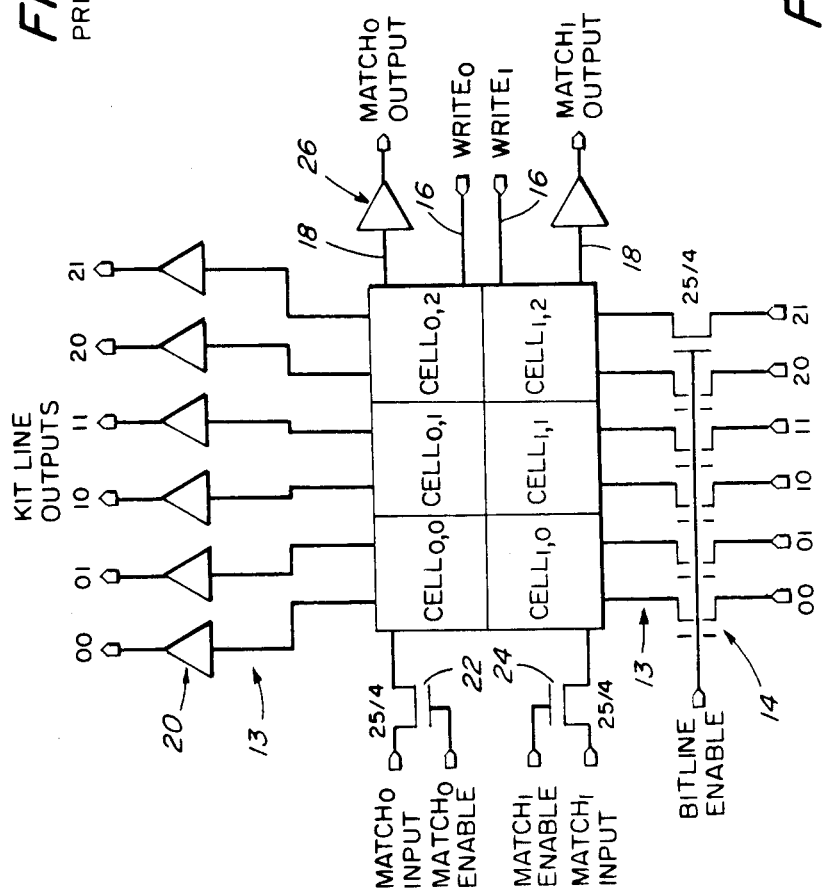
FIG. 1

THREE-TRANSISTOR CONTENT ADDRESSABLE MEMORY

BACKGROUND

The computational power achieved in modern general-purpose computers is primarily attributed to the high switching speed and small signal delays of the semiconductor microcircuits, whereas the structure of their basic architectures has remained relatively unchanged. The conventional von Neumann computer architecture suffers from a serious fundamental handicap which is due to its method of addressing memory. Memory is accessed serially by location, and that addressing approach consumes a great deal of time and leaves a vast proportion of the memory hardware idle. Also, much time is spent on purely searching and sorting tasks needed for memory management. One alternative is to use Content-Addressable Memories (CAMs) in a computational data base.

A content-addressable memory is defined to be a storage device that stores data in a number of cells which can be accessed or loaded on the basis of their contents. In its simplest form, a CAM can be used to store and access data according to address location and also to determine the address location of presented data. These are the Write, Read, and Search operations, respectively. The memory can be made more powerful by incorporating additional logic whereby a "don't care" state, as well as the "1" and "0" states, can be presented to the CAM so that certain bits can be masked from the search operation. Additional flexibility results from the ability to store the "don't care" state in the memory itself.

For speed and simplicity, all cells are compared simultaneously in parallel, and a single mismatch on any of the cells signals a mismatch for the entire word. With the parallel approach, the data must be stored such that a search operation will not destroy it. To do this, the data should be stored on an active device in such a way that when a "mismatch" is presented, the device changes its output while retaining its state.

The storage can be achieved in a number of ways. Presently, however, insulated gate field effect transistor (IGFET) technologies are most attractive when density, speed, power dissipation and cost are taken into account. It is convenient to build the memory cell and the support circuitry in the same technology. Therefore, the active device of greatest interest is the IGFET. At a minimum, the cell needs to be able to signal exact matches or mismatches, as well as have the capability to be externally masked. Therefore, three possible states must be presented to it, requiring two bitlines in a binary system. Since the IGFET is a unidirectional device and there are two bitlines which need to be compared, at least two active devices are needed. In summary, the minimum requirements for an IGFET CAM cell are: (1) two FETs to store data, (2) two bitlines for '1', '0', and "don't care" comparisons, (3) an output line to signal a match or mismatch, and (4) a means to store charge on the gates of the two FETs.

In the usual CAM cell design there are two bitlines that run vertically through all the words in the column; those bitlines are used both to carry data to be written into the cells and to present data against which a match is to be made. A Match line runs horizontally connecting an entire word and serves as a wired-or for mismatches. The Match line remains high if each cell in the CAM word matches the presented data on the bitlines. Conversely, if any cell in the word mismatches the presented data, the Match line is discharged to a lower potential. The Match line is also used to read the CAM word during the refresh operation. A Write line passes through each cell to provide a means for isolating all but the cells of interest from a write cycle.

One CAM cell design is presented by Joseph L. Mundy in U.S. Pat. No. 3,701,980 and is shown here in FIG. 2. To write to this cell, the data is stored on the $M_S$ transistors and is accessed using the $M_W$ transistors. Writing is accomplished by choosing a particular word, raising its Write line to a high potential, and driving the desired logic levels on the bit 1 and bit 0 lines. The $M_W$ transistors are turned on by the Write signal to allow the gates of the $M_S$ transistors to be charged or discharged through the bit lines. A logic level "1" for the cell might be recognized as a high potential on $M_{S1}$ and a low potential on $M_{S0}$. A logic "0" would be the inverse low potential on $M_{S1}$ and high potential on $M_{S0}$. An internal "don't care" mask can be made by discharging both $M_S$ transistor gates.

Searching is accomplished by holding the Match line at a high potential while the bitlines are moved to their desired potentials. If a bitline is lowered on a branch where a high potential is stored on the gate of the $M_S$ transistor, current flows from the Match line through the "on" MS transistor to the bitline and a mismatch is detected. For example, if $M_{S1}$ has a high potential stored on its gate and is thus "on" and the bit 1 line is lowered, current flows from the Match line. If no current flows from any of the bits in a word, a match is detected.

Addressed Reading is required to refresh the cell and is accomplished by keeping the Write line and the two bit lines at ground and raising the potential of the Match line for a specific word. Current then flows on a bit line if it is on a branch with a high potential stored on the $M_S$ transistor. It is interesting to note that the search and read cycles are essentially the same except that the roles of the Match and bit lines are interchanged. Refresh is accomplished using a word-by-word Read and Write refresh cycle.

The Mundy cell has the advantages and disadvantages that one would expect of a dynamic memory design. The cell is quite dense and has fast current driven Read and Search operations. Due to its dynamic nature, however, it requires a word-by-word Read-Write refresh cycle.

DISCLOSURE OF THE INVENTION

In accordance with the present invention a content addressable memory cell comprises two storage field effect transistors connected to respective bitlines. One storage transistor is a p-type FET and the other storage transistor is an n-type FET. A Write FET is connected between the gates of the storage transistors and one of the bitlines to store a potential, which is presented on that bitline, onto the gates of the storage transistors. In a specific implementation, the first storage FET is connected between the first bitline and a Match line and the second storage FET is connected between the second bitline and the Match line. The gate of the Write FET is connected to a Write line. A diode may be connected between a common connection of the storage transistor drains and the Match line.

BRIEF DESCRIPTION OF THE DRAWINGS

The foregoing and other objects, features and advantages of the invention will be apparent from the following more particular description of a preferred embodiment of the invention, as illustrated in the accompanying drawings in which like reference characters refer to the same parts throughout the different views. The drawings are not necessarily to scale, emphasis instead being placed on illustrating the principles of the invention.

FIG. 1 is a schematic illustration of a simple memory array comprising two three-bit words to illustrate use of the memory cell;

FIG. 2 is a schematic illustration of the prior art Mundy memory cell;

FIG. 3 is a schematic illustration of a memory cell embodying the present invention;

DESCRIPTION OF PREFERRED EMBODIMENTS

FIG. 1 illustrates a simple two-word, three-bit memory in which the memory cell of the present invention may be used. Although in practice a typical memory array would consist of many more words containing a larger number of bits, this example will illustrate the use of the cell. The six cells of this memory array form two vertically stacked words of three laterally disposed bits.

The cell for each bit may be set to one of three states, a "1", a "0" or a "don't care". These states are established during a Write cycle for each word by placing a high signal on the Write line for that word and by placing the appropriate inputs on the six bitlines 12. During the Write cycle, all bitline inputs are enabled by a bank of FETs 14. The address of the word into which the information is being written is established by a high signal on one of the Write lines 16. The "1" state may, for example, be designated by high and low inputs to that particular cell; a "0" state may be designated by low and high inputs to the cell; and a "don't care" state may be designated by two low inputs to the cell.

During a refresh cycle in which the bits are stored in a word are read and rewritten into the memory cells, the stored states are read from the bit lines 12 through sense amplifiers 20. The particular word being read is determined by the match inputs through FETs 22 and 24.

During a search operation, a word is applied to the bitline inputs 12 and simultaneously compared to all of the stored words. Match lines for all words are enabled by the FETs 22 and 24. Where a stored word is determined to be the same as the input word, or different only by "don't care" bits, the Match line for that word remains high. Where a mismatch is detected, the Match line is pulled low. The match outputs are detected by sense amplifiers 26. Whereas a stored "don't care" may be indicated by two stored lows, a presented "don't care" during a match operation may be indicated by two high signals on the two bit lines.

A memory cell which provides the required functions for a content addressable memory using only four transistor elements is illustrated in FIG. 2. Two storage transistors $M_{S1}$ and $M_{S0}$ are connected drain-to-source between the Match line and respective bitlines. For reasons discussed below, a FET $M_D$ is connected as a diode between the Match line and the common drain of the FETs $M_{S1}$ and $M_{S0}$.

A "1", "0" or "don't care" is stored as charge on the gates of the storage transistors. The gates are accessed during a Write cycle by respective Write transistors $M_{W1}$ and $M_{W0}$ connected between the gates of the storage transistors and the respective bitlines. The two Write transistors are gated on by a high signal on the Write line. To store a "1" in the memory cell, a high signal is applied to bit 1 and a low signal to bit 0. With the two Write transistors gated on by the Write line, the high potential on bitline 1 charges the gate of the FET $M_{S1}$ through the Write transistor $M_{W1}$. Similarly, the low signal on bitline 0 causes the gate of storage transistor $M_{S0}$ to discharge through the Write transistor $M_{W0}$. When the Write transistors are then turned off by a low signal on the Write line 16, the charge then is isolated on the gates of the storage transistors.

The memory cell can be read by addressing the cell with a high signal on the Match line and low signals on the bitlines. If a high potential is stored on the gate of a storage transistor, that transistor is held "on" and current flows from the high Match line to the low bitline and can be detected by a sense amplifier 20. On the other hand, if a low potential is stored on the storage transistor, the transistor is off and no current flows from the Match line to the bitline. The state of the cell is not destroyed by the Read cycle.

During a search operation, the Match line is held high for all words and the bit pattern being searched for is applied to the bitlines. If a high potential is stored on the gate of a MW transistor, so that the transistor is "on", and a like high signal is applied to that transistor from the bitline, there is no current flow through the transistor because of the high potential at both the source and the drain of the FET. If the stored potential is low, the transistor remains "off" regardless of the potential applied on the bitline. If, however, the stored potential is high and a low level is applied to the bitline of that transistor, a mismatch condition is detected by current flow from the Match line through the transistor to the bitline. This mismatch can be sensed by the sense amplifier 26 as a drop in potential. A match is indicated on a Match line only if no bit within a word has a mismatch which draws current from the Match line.

It can be seen, then, that if the high/low input on the bitlines matches the high/low storage potentials, no current is drawn through the cell and a match is detected. Similarly, low/high bit signals compared to low/high stored signals result in a match. However, a high/low comparison to a low/high results in current flow through the "on" transistor to the low bitline. A "don't care" state can be established in the memory cell by pulling the gates of both storage transistors low during the Write cycle so that neither will turn "on" to discharge the Match line during a search operation. On the other hand, a "don't care" can be presented to the memory cell during a search operation by setting both bitlines high so that no current flows from the Match line regardless of the stored charges.

The FET $M_D$ is in a diode with its gate connected to its drain. It is not required for operation of the single memory cell but it is important in minimizing sneak current paths between memory cells of an array. If the Match line were directly coupled to the drains of the storage transistors, a transistor which draws current in a mismatch situation might draw current through an FET from another bitline connected to the same match line. For example, current might flow from a high bitline through a storage transistor of an adjacent cell which is turned "on", through the Match line, and down through the storage transistor to a mismatched low bitline. This results in excessive current flow and reduced voltage swing on the Match line. The diode connected between the Match line and the storage transistors prevents the reverse current flow through the adjacent memory cell.

Another way to avoid the problem of sneak current paths between memory cells is to use a low input impedance transresistance amplifier to sense the Match line. This would keep the Match line voltage from moving enough to turn on the transistor which is presented with a high potential on its bitline. In that case the diode $M_D$ would not be required.

A modified memory cell embodying the present invention is illustrated in FIG. 3. In this 1 memory cell, the storage transistors $M_{S1}$ and $M_{S0}$ are of opposite conductivity types, so that the complement of matching signal can be stored on the gate of one of the transistors. For example, $M_{S1}$ may be formed in an n-type semiconductor and $M_{S0}$ in a p-type semiconductor. The two storage transistors have their gates connected in common. Thus, the storage capacitance may be effectively increased.

A positive potential stored on the gates of the two storage transistors results in a low channel resistance in the transistor $M_{S1}$ and a high resistance in the transistor $M_{S0}$. A negative stored potential results in a high resistance in $M_{S1}$ and a low resistance in $M_{S0}$. With a positive stored potential, a high/low input on the bit 1 and bit 0 bitlines during the search operation results in no current flow and is thus seen as a match. On the other hand, a low/high input results in current flow through $M_{S1}$ to indicate a mismatch. Where a negative potential is stored on the gates, $M_{S0}$ is "on" and a high/low input on the bitline results in current flow through to indicate a mismatch. A low/high input would not result in current flow through $M_{S0}$ and a match would be indicated. The memory cell does not allow for storage of a "don't care" state.

Because only a single potential is stored, only a single Write transistor $M_W$ is required. This may result in increased density. $M_W$ is shown connected between the gates of the storage transistors and bitline 1. As such, a positive or negative potential is stored on the storage transistor gates by providing a high potential on the Write line and the desired stored potential on the bitline 1. If $M_W$ were a p-type FET, a negative signal on the Write line would be required for the Write operation. Either an n-type or a p-type Write FET could alternatively be connected between the gates of the storage transistors and bitline 0. In that case, the signal would be applied to bitline 0 during the Write operation. As with the Mundy memory cell, a diode device $M_D$ may be provided between the common drain connection of the storage transistors and the Match line.

While the invention has been particularly shown and described with reference to a preferred embodiment thereof, it will be understood by those skilled in the art that various changes in form and details may be made therein without departing from the spirit and scope of the invention as defined by the appended claims.

We claim:

1. A content addressable memory cell comprising:
    a p-type storage transistor coupled to a first bitline and an n-type storage transistor coupled to a second bitline, the storage transistors having their gates connected in common for storing a potential thereon; and
    a write transistor coupled between the commonly connected gates of the storage transistors and one of the bitlines to transmit a potential, which is presented on said one of the bitlines for storage onto the gates of the storage transistors.

2. A memory as claimed in claim 1 wherein the transistors are insulated gate field effect transistors.

3. A memory as claimed in claim 1 wherein the p-type storage transistor is directly connected to the first bitline, the n-type storage transistor is directly connected to the second bitline, and the write transistor is directly connected between the commonly connected gates and said one of the bitlines.

4. A content addressable memory cell comprising:
    a match line, first and second bit lines and a write line;
    a first storage transistor of a first conductivity type coupled between the first bitline and the match line;
    a second storage transistor of a second conductivity type coupled between the second bitline and the match line, the first and second storage transistor having their gates connected in common; and
    a write transistor, connected between the commonly connected gates of the first and second storage transistors and one of the bitlines, and having its gate connected to the write line.

5. A memory as claimed in claim 4 wherein the transistors are insulated gate field effect transistors.

6. A memory cell as claimed in claim 4 further comprising a diode connected between the match line and the storage transistors.

* * * * *